United States Patent
Kushibiki et al.

(10) Patent No.: US 8,202,805 B2
(45) Date of Patent: Jun. 19, 2012

(54) SUBSTRATE PROCESSING METHOD

(75) Inventors: Masato Kushibiki, Nirasaki (JP); Eiichi Nishimura, Nirasaki (JP)

(73) Assignee: Tokyo Electron Limited, Tokyo (JP)

( * ) Notice: Subject to any disclaimer, the term of this patent is extended or adjusted under 35 U.S.C. 154(b) by 32 days.

(21) Appl. No.: 12/720,197

(22) Filed: Mar. 9, 2010

(65) Prior Publication Data

US 2010/0233885 A1 Sep. 16, 2010

Related U.S. Application Data

(60) Provisional application No. 61/176,510, filed on May 8, 2009.

(30) Foreign Application Priority Data

Mar. 13, 2009 (JP) ................................. 2009-061139

(51) Int. Cl.
*H01L 21/00* (2006.01)
(52) U.S. Cl. ........ 438/771; 438/778; 438/781; 438/790; 257/E21.283
(58) Field of Classification Search .................. 438/313, 438/778, 780, 781, 790
See application file for complete search history.

(56) References Cited

U.S. PATENT DOCUMENTS

| 7,482,280 B2 * | 1/2009 | Chang et al. .................. 438/725 |
| 2005/0098091 A1 * | 5/2005 | Babich et al. ..................... 117/4 |
| 2006/0141766 A1 | 6/2006 | Kim |
| 2010/0130015 A1 * | 5/2010 | Nakajima et al. ............. 438/703 |

FOREIGN PATENT DOCUMENTS

| JP | 02071370 | * 12/1991 |
| JP | 04223794 | * 3/1994 |
| JP | 2004-134553 | 4/2004 |
| JP | 2006-190939 | 7/2006 |

\* cited by examiner

*Primary Examiner* — Kevin M Picardat
*Assistant Examiner* — Neil Prasad
(74) *Attorney, Agent, or Firm* — Oblon, Spivak, McClelland, Maier & Neustadt, L.L.P.

(57) ABSTRACT

A method for processing a substrate including a processing target layer and an organic film, include: a deposition/trimming process of forming a reinforcement film on a surface of the organic film and, at the same time, trimming a line width of a line portion of the organic film constituting an opening pattern. The deposition/trimming process includes an adsorption process for allowing a silicon-containing gas to be adsorbed onto the surface of the organic film and an oxidation process in which the line width of the organic film is trimmed while the adsorbed silicon-containing gas is converted into a silicon oxide film. A monovalent aminosilane is employed as the silicon-containing gas.

18 Claims, 3 Drawing Sheets

SUBSTRATE PROCESSING METHOD

CROSS-REFERENCE TO RELATED APPLICATIONS

This application claims priority to Japanese Patent Application No. 2009-061139 filed on Mar. 13, 2009, the entire contents of which are incorporated herein by reference.

FIELD OF THE INVENTION

The present invention relates to a substrate processing method; and, more particularly, to a substrate processing method for making a fine line width of a line portion of an organic film in which an opening pattern is formed while forming a reinforcement film on a surface of the organic film serving as a mask layer.

BACKGROUND OF THE INVENTION

There has been disclosed a wafer for a semiconductor device where an impurity-containing oxide film, e.g., a tetra ethyl ortho silicate (TEOS) film, produced by a chemical vapor deposition (CVD) or the like; an electrically conductive film, e.g., a titanium nitride (TiN) film; a bottom anti-reflective coating (BARC) film; and a mask layer (photoresist film) are stacked in that order on a silicon substrate (see, e.g., Japanese Patent Application Publication No. 2006-190939 and corresponding US patent Application Publication No. 2006-141766 A1). The photoresist film is processed to have a predetermined pattern by photolithography and serves as a mask layer when the BARC film and the conductive film are etched.

As the scaling down of semiconductor devices has recently been in progress, it is needed to form a finer circuit pattern on a surface of the wafer described above. In order to form such a finer circuit pattern, it is required to form a small-sized opening (a via hole or a trench) on an etching target film by reducing a minimum feature dimension of the pattern of the photoresist film in the manufacturing process of a semiconductor device.

In order to form the small-sized pattern on the photoresist film, a highly transparent material may be employed to improve a pattern transfer fidelity by an exposure light. Since, however, such a highly transparent material has a low hardness, the strength of the mask layer is deteriorated, causing a pattern collapse. As a result, it becomes difficult to obtain a satisfactory etching resistance.

Such a trend is more strongly shown in a pattern having a line width of 10 nm or less and a high aspect ratio, for example. As such, a formation of a finer pattern and an etching resistance are in a trade-off (antinomy) relationship in the mask layer, e.g., the photoresist film.

In the meantime, there has been disclosed a technique for forming a fine line width of a line portion of a mask layer in the manufacturing process of a semiconductor device (see, e.g., Japanese Patent Application Publication No. 2004-134553)

In this Japanese Patent Application Publication, a resist pattern forming method has been disclosed. Specifically, a resist film is formed on a base layer of a wafer by employing a resist material that can be contracted by the irradiation of an electron beam and, then, a resist pattern having a specific line width is formed by subjecting the resist film to an exposure treatment. Thereafter, by irradiating an electron beam, the line width of the resist pattern is reduced.

Although the scaling-down (hereinafter, referred to as "trimming") of the line width of the resist pattern can be accomplished by the aforementioned technique, the trimmed resist pattern is not reinforced, causing a pattern collapse. Accordingly, it is difficult to form in a processing target layer a small-sized opening that meets the demand for the scaling-down of a semiconductor device.

SUMMARY OF THE INVENTION

In view of the above, the present invention provides a substrate processing method capable of forming on a target layer a small-sized opening that meets a demand for the scaling-down of a semiconductor device.

In accordance with an embodiment of the present invention, there is provided a method for processing a substrate including a processing target layer and an organic film. The method includes a deposition/trimming process of forming a reinforcement film on a surface of the organic film and, at the same time, trimming a line width of a line portion of the organic film constituting an opening pattern.

BRIEF DESCRIPTION OF THE DRAWINGS

The objects and features of the present invention will become apparent from the following description of embodiments, given in conjunction with the accompanying drawings, in which.

DETAILED DESCRIPTION OF THE EMBODIMENTS

An embodiment of the present invention will now be described with reference to the accompanying drawings which form a part hereof.

A substrate processing apparatus in which a substrate processing method in accordance with the embodiment of the present invention is carried out will be described first. The substrate processing apparatus is an apparatus (referred to as "deposition/trimming apparatus") for trimming a line width of a line portion of an organic film of a semiconductor wafer W serving as a substrate, wherein, in the organic film, an opening pattern is formed while a reinforcement film is formed on a surface of the organic film by molecular layer deposition (MLD). Here, when a plasma is generated, a power can be increased to, e.g., approximately 500 W to 3,000 W.

Figure 1:
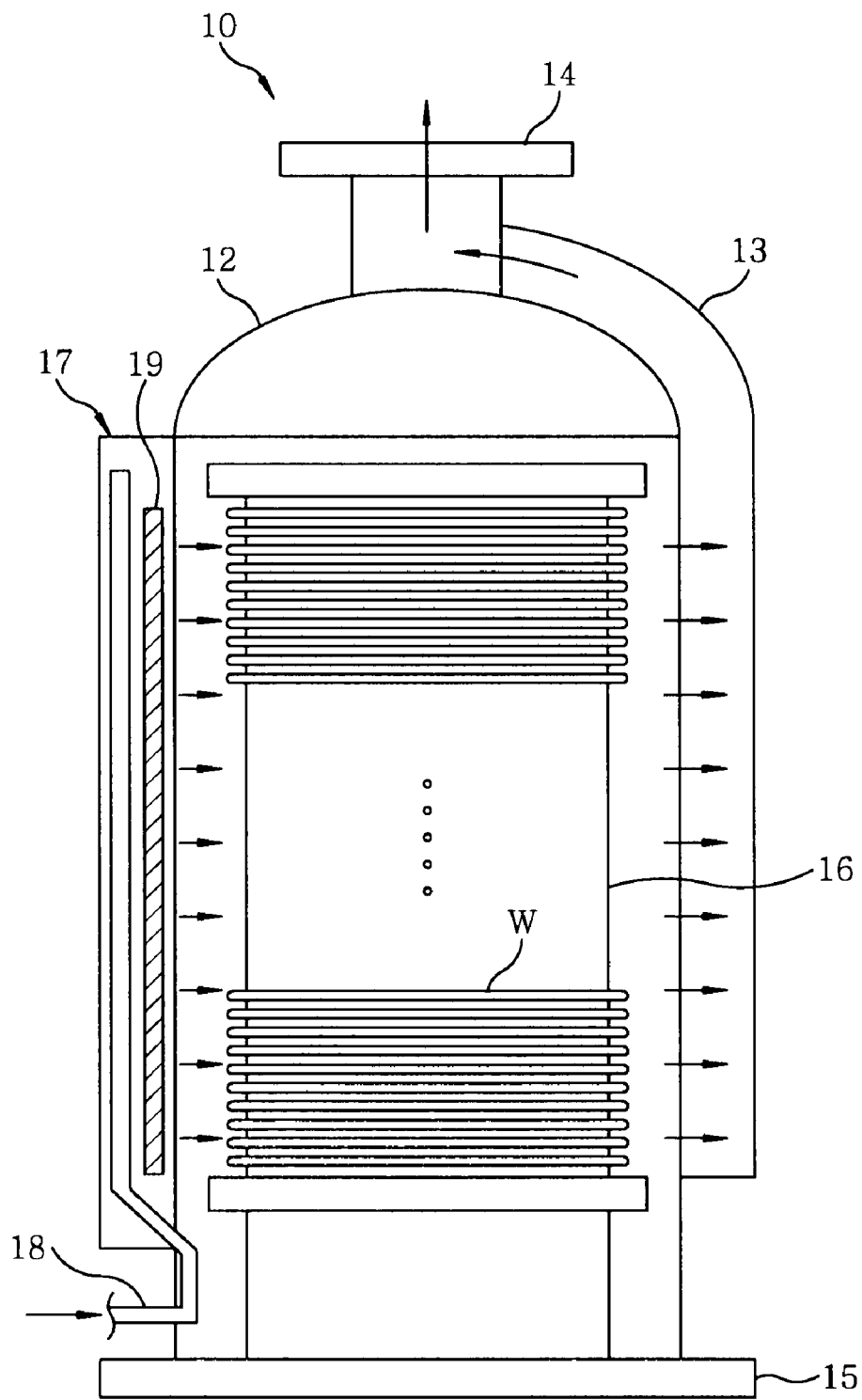
FIG. 1 is a cross sectional view schematically showing a structure of a deposition/trimming apparatus in which a substrate processing method in accordance with an embodiment of the present invention is carried out.

FIG. 1 is a cross sectional view schematically showing a structure of a deposition/trimming apparatus 10 in which the substrate processing method in accordance with the embodiment of the present invention is carried out. The deposition/trimming apparatus 10 is a batch type. Alternatively, it can be a single-sheet type.

As shown in FIG. 1, the deposition/trimming apparatus 10 is provided with a bell jar type reaction tube 12 having a substantially cylindrical shape with a ceiling. The reaction tube 12 is made of a high heat-resistant and corrosion-resistant material, e.g., quartz.

Provided on a portion of an outer surface of the reaction tube 12 is an exhaust path 13 through which a gas inside the reaction tube 12 is exhausted. The exhaust path 13 upwardly extends along the reaction tube 12 to communicate with the inside of the reaction tube 12 via a plurality of openings. A top portion of the exhaust path 13 is connected to an exhaust port 14 provided at a top portion of the reaction tube 12. A pressure control mechanism (not shown) is provided at the exhaust port 14 and the pressure inside the reaction tube 12 is controlled to a preset vacuum level by the pressure control mechanism.

A lid 15 made of, e.g., quartz is arranged at the bottom of the reaction tube 12. The lid 15 is vertically movable by an elevator unit. Specifically, when the lid 15 is upwardly moved, a bottom side (fire hole portion) of the reaction tube 12 is closed. When the lid 15 is downwardly moved, the bottom side of the reaction tube 12 is opened.

A wafer boat 16 made of, e.g., quartz is mounted on the lid 15, and a plurality of horizontally disposed wafers W serving as target substrates are accommodated in a vertical direction at a predetermined interval therebetween in the wafer boat 16. A heater (not shown) is arranged around the reaction tube 12 to control the temperature therein.

Provided to the reaction tube 12 are an oxidizing gas supply line 18 for introducing an oxidizing gas and a processing gas supply line (not shown) for introducing a processing gas other than the oxidizing gas. The oxidizing gas supply line 18 is connected to the reaction tube 12 via the plasma generation unit 17. Accordingly, the oxidizing gas flows through the oxidizing gas supply line 18 and, then, is converted to active oxygen (referred to as "oxygen radicals") by being plasma-excited by a pair of electrodes 19 provided in the plasma generation unit 17. Thereafter, the oxygen radicals are introduced into the reaction tube 12.

The processing gas supply line is arranged in parallel with the oxidizing gas supply line 18 and is directly connected to the reaction tube 12. A dispersion injector, for example, is employed as the processing gas supply line. The processing gases supplied to the reaction tube 12 may include, e.g., a source gas, an oxidizing gas, a dilution gas, a purge gas, and the like. A processing gas other than the oxidizing gas, i.e., the source gas, the dilution gas, the purge gas or the like is introduced into the reaction tube 12 through the processing gas supply line.

The source gas allows silicon as a source to be adsorbed onto a surface of an organic film of a target substrate. A silicon-containing gas, a monovalent aminosilane, e.g., $SiH_3(NHC(CH_3)_3)$ or $SiH_3(N(CH_3)_2)$, can be adequately employed as the source gas. The oxidizing gas oxidizes the source (silicon) adsorbed onto the target substrate, and an oxygen-containing gas is employed as the oxidizing gas. As the oxygen-containing gas, $O_2$ gas of a pure water may be employed. Alternatively, a gas in which the $O_2$ gas is adequately diluted with $N_2$ gas or the like may be employed as the oxygen-containing gas.

The dilution gas serves to dilute other processing gas. For example, $N_2$ gas may be employed. Moreover, a nonreactive gas, e.g., $N_2$ gas, may be employed as the purge gas. Other gases than the oxidizing gas are not plasma-excited (activated). A plurality of supply holes (not shown) is vertically arranged at a preset interval therebetween in each of the oxidizing gas supply line 18 and the processing gas supply line. The processing gas is supplied to the reaction tube 12 through the supply holes.

The deposition/trimming apparatus 10 includes a controller (not shown) for controlling various components thereof and various sensors installed as necessary.

Hereinafter, a deposition/trimming process of a substrate processing method in accordance with the embodiment of the present invention performed in the deposition/trimming apparatus 10 will be described in detail.

Through the deposition/trimming process, a line width of a line portion constituting an opening pattern in the mask film is trimmed while a reinforcement film made of, e.g., an oxide film is formed on a surface of the photoresist film of a wafer W by MLD.

In accordance with a deposition/trimming process program for performing the deposition/trimming process on the photoresist film of the wafer W, the deposition/trimming process is carried out by the controller of the deposition/trimming apparatus 10.

Figure 2:
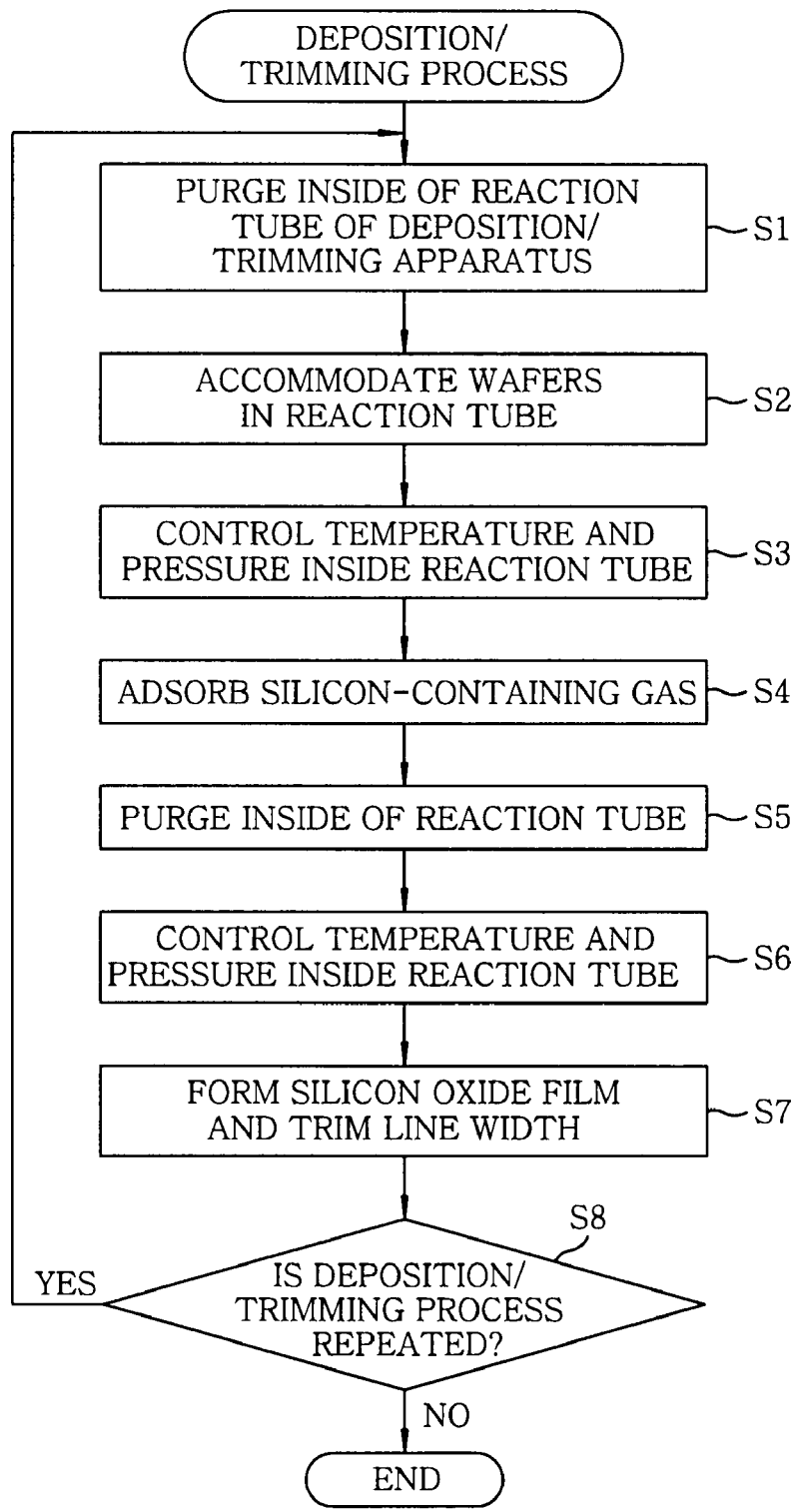
FIG. 2 is a flow chart showing a deposition/trimming process of the substrate processing method in accordance with the embodiment of the present invention.

FIG. 2 is a flow chart showing the deposition/trimming process of the substrate processing method in accordance with the embodiment of the present invention.

As shown in FIG. 2, to carry out the deposition/trimming process, the inside of the reaction tube 12 is first purged by directly introducing $N_2$ gas from the processing gas supply unit into the reaction tube 12 of the deposition/trimming apparatus 10 shown in FIG. 1 (step S1). Thereafter, the wafer boat 16 accommodating a plurality of wafers W thereon is mounted on the lid 15 and, then, the wafers W are accommodated in the reaction tube 12 by upwardly moving the lid 15 (step S2).

Then, a temperature and a pressure inside the reaction tube 12 are controlled to preset levels, e.g., approximately 400° C. and $6.65 \times 10$ Pa(500 mTorr), respectively, (step S3) and, then, in this state, the silicon-containing gas, e.g., monovalent aminosilane $SiH_3(NHC(CH_3)_3)$ is introduced thereto through the processing gas supply line and is adsorbed onto a surface of a photoresist film of each of the wafers W (step S4) (adsorption process). After the silicon-containing gas is adsorbed onto the surface of the photoresist film, the residual silicon-containing gas or the like inside the reaction tube 12 is purged by introducing the $N_2$ gas thereto through the processing gas supply line (step S5).

Thereafter, the temperature inside the reaction tube 12 where the excess silicon-containing gas or the like has been purged is set to, e.g., approximately 400° C. and the pressure therein is controlled to, e.g., approximately $6.65 \times 10$ Pa(500 mTorr) (step S6) by supplying the $N_2$ gas, for example. Then, e.g., $O_2$ gas is supplied into the reaction tube 12 through the oxidizing gas supply line 18; and a high frequency power of, e.g., 500 W to 3000 W is applied between the electrodes 19 of the plasma generation unit 17, thereby plasma-exciting oxygen to generate oxygen radicals, which are then are supplied to the reaction tube 12. Thus, the silicon-containing gas adsorbed onto the photoresist film is oxidized, into a silicon oxide film and, hence, the photoresist film is reinforced; and, at the same time, the line portion is trimmed (step S7) (Oxidation process).

In step S7, C and H components of the silicon-containing gas are vaporized and removed as, e.g., $CO_2$ and $H_2O$, respectively, and Si is converted to, e.g., $SiO_2$. Moreover, C component of the line portion of the mask layer constituting the opening pattern is vaporized as $CO_2$. Accordingly, the surface of the line portion of the photoresist film is reinforced by the silicon oxide film, and, at the same time, the line portion is trimmed.

Thereafter, the supply of the oxygen-containing gas is stopped and the inside of the reaction tube 12 is purged by introducing the $N_2$ gas thereinto through the processing gas supply line to thereby complete one cycle of the deposition/trimming process.

Then, it is determined whether the cycle of the deposition/trimming process needs to be repeated (step S8) and the steps S1 to S7 are repeatedly carried out as required until the whole deposition/trimming process is completed. If it is determined that the cycle of the deposition/trimming process needs not to be repeated any more, the deposition/trimming process is completed.

By the deposition/trimming process shown in FIG. 2, the silicon-containing gas is adsorbed onto the surface of the photoresist film of the wafer W (adsorption process), and the oxygen radicals are generated by plasma-exciting the oxygen. Then, by using the generated oxygen radicals, the adsorbed silicon-containing gas is oxidized to be converted into the silicon oxide film and, at the same time, the line portion is trimmed by removing the C component thereof (oxidation process).

Accordingly, when a line width of a line portion of a photoresist film (mask layer) constituting the opening pattern has, e.g., approximately 30 nm at the beginning of the process, the line width can be reduced to, e.g., approximately 7 nm. At this time, since opposite sides of the line portion are reinforced by a silicon oxide film, no collapse may occur in the trimmed line pattern.

In addition, by the deposition/trimming process shown in FIG. 2, formation of the silicon oxide film and trimming of the line portion of the photoresist film can be performed at the same time. Accordingly, the number of the processing steps can be reduced as compared with a conventional method in which trimming the line portion of a photoresist film is carried out first and, then, sidewalls are formed to embed the trimmed line portion therebetween.

Further, unlike the conventional method, it is not necessary to transfer a wafer to another substrate processing apparatus in order to form sidewalls after trimming the line portion of the photoresist film. Accordingly, defects can be less generated.

In the present embodiment, the photoresist film on which the deposition/trimming process is performed is an organic film having a line width, e.g., approximately 60 nm or less, of a line portion constituting the opening pattern. An organic film having a line width that is beyond approximately 100 nm is not practical due to too much trimming amount.

In accordance with the deposition/trimming process shown in FIG. 2, the silicon-containing gas is adsorbed onto the photoresist film in the adsorption process and, then, the adsorbed silicon-containing gas is converted into the silicon oxide film in the oxidation process. Especially, as the silicon-containing gas is converted into the silicon oxide film, the silicon oxide film becomes thicker and the line width of the line portion constituting the opening pattern becomes thinner.

In such a deposition/trimming process, the silicon-containing gas is uniformly adsorbed onto the surface of the photoresist film in the adsorption process. Accordingly, the silicon oxide film obtained by oxidizing the adsorbed silicon-containing gas becomes a homogeneous reinforcement film having an even thickness.

In the deposition/trimming process shown in FIG. 2, the processing cycle of the steps S1 to S7 is typically repeated in several tens to several hundreds times. As for a point of time when the deposition/trimming process is completed, the number of repetitions of the cycles may be determined by empirically considering how many times the cycle is required to be repeated to obtain a desired mask layer and, then, a point of time when the cycle need not be repeated any more may be considered as the point of time when the deposition/trimming process is completed.

In this case, the line width of the line portion of the photoresist film depends on the number of the repeated cycles, the temperature and the pressure inside the reaction tube 12, the power applied in generating the oxygen radicals, and the like.

In the adsorption process of the deposition/trimming process shown in FIG. 2, the temperature inside the reaction tube 12 is preferably in the range from approximately 20° C. to 700° C. If the temperature inside the reaction tube 12 is lower than approximately 20° C., the silicon-containing gas may be insufficiently adsorbed onto the photoresist film in the adsorption process. If the temperature therein is higher than approximately 700° C., a film quality or a film thickness of the silicon oxide film may become nonuniform after the oxidation process.

However, if the temperature inside the reaction tube 12 in the adsorption process is in the range from approximately 20° C. to 700° C., the silicon-containing gas can be properly adsorbed onto the photoresist film and, thus, it is possible to form a homogeneous silicon oxide film having an even thickness.

In the adsorption process of the deposition/trimming process shown in FIG. 2, the pressure inside the reaction tube 12 is preferably in the range from approximately $1.33 \times 10^{-1}$ Pa(1 mTorr) to $1.33 \times 10$ kPa(100 Torr). In this range of pressure, it is possible to make adequate the adsorption state of the silicon-containing gas onto the photoresist film.

In the oxidation process of the deposition/trimming process shown in FIG. 2, the supply amount of the oxygen-containing gas can vary depending on an oxygen concentration in the oxygen-containing gas, a plasma excitation state or the like. However, it is preferable to supply the oxygen-containing gas that can convert into the silicon oxide film the silicon-containing gas adsorbed onto the photoresist film and to trim the line width of the line portion to a preset level, e.g., approximately 7 nm.

In the oxidation process of the deposition/trimming process shown in FIG. 2, the power supplied from the plasma generation unit 17 is preferably in the range from, e.g., approximately 500 W to 3000 W. The pressure of the plasma generation unit 17 is preferably in the range from approximately $1.33 \times 10^{-1}$ Pa(1 mTorr) to $1.33 \times 10^{2}$ Pa(1000 mTorr). In these ranges of power and pressure, it is possible to properly generate a plasma and properly supply oxygen radicals to the reaction tube 12.

In the oxidation process of the deposition/trimming process shown in FIG. 2, the pressure inside the reaction tube 12 is preferably in the range from approximately $1.33 \times 10^{-1}$ Pa(1 mTorr) to $1.33 \times 10$ kPa(100 Torr). In this range of pressure, it is possible to adequately convert into the silicon oxide film the silicon-containing gas adsorbed onto the surface of the photoresist film and properly trims the line portion at the same time.

In the oxidation process of the deposition/trimming process shown in FIG. 2, the temperature inside the reaction tube 12 is preferably in the range from approximately 20° C. to 700° C. In this range of temperature, it is possible to satisfactorily convert into the silicon oxide film the silicon-containing gas adsorbed onto the surface of the photoresist film and easily control such a conversion.

In the deposition/trimming process shown in FIG. 2, the monovalent aminosilane is employed as the silicon-containing gas. Alternatively, divalent or trivalent aminosilane may be employed instead. For example, bistertialbutyl-aminosilane (BTBAS: $SiH_2(NHC(CH_3)_3)_2$) and tridimethyl-aminosilane (3 DMAS: $SiH(N(CH_3)_2)_3$) may be employed as the divalent and the trivalent aminosilane, respectively.

As for a wafer W that has been subjected to the deposition/trimming process shown in FIG. 2, it is preferable to perform, e.g., a reinforcement film etching process on the wafer W, wherein a part of the silicon oxide film serving as the reinforcement film is etched to expose the trimmed line portion. By etching and removing the exposed line portion after the reinforcement film etching process, it is possible to obtain a mask layer made of the silicon oxide film, i.e., the reinforcement film having an opening pattern with a fine width, which can yield the same effect as in a double patterning.

Figure 3A:
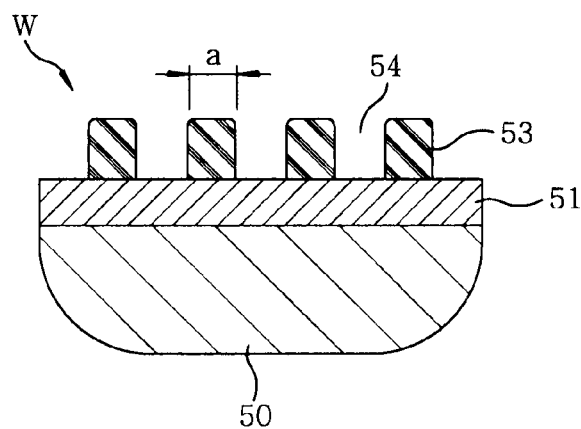
FIGS. 3A to 3C are a detailed example of the deposition/trimming process shown in FIG. 2.
Figure 3B:
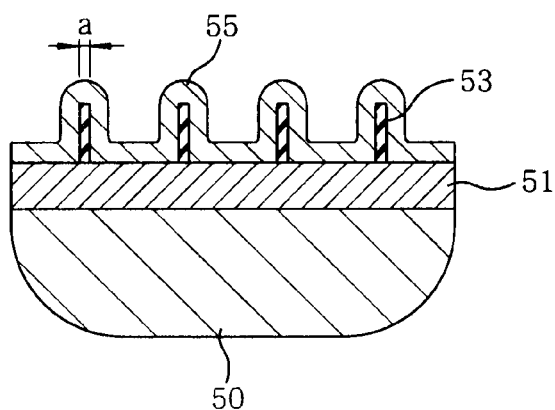
Figure 3C:
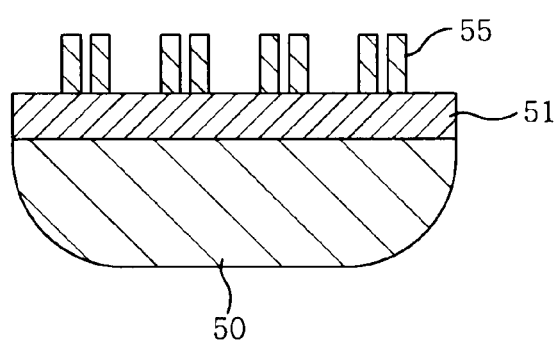

FIGS. 3A to 3C are a detailed example showing the deposition/trimming process shown in FIG. 2. As shown in FIG. 3A, in a wafer W, a polysilicon film 51 serving as a processing target layer is formed on a surface of a silicon substrate 50; and a photoresist film (mask layer) 53 is formed on the polysilicon film 51. Predetermined openings 54 are formed in the photoresist film 53.

If the deposition/trimming process is performed on the photoresist film 53 whose line portion has a line width "a" of, e.g., approximately 30 nm, the line width a of the line portion is trimmed to, e.g., approximately 10 nm or less and, at the same time, the line portion of the photoresist film 53 is reinforced by a silicon oxide film 55.

Thereafter, the wafer W is transferred to an etching processing apparatus. Then, a part of the silicon oxide film 55 is removed by using a plasma of a processing gas including carbon tetrafluoride ($CF_4$) gas to expose the photoresist film 53 and, then, the exposed photoresist film 53 is removed by using a plasma of a processing gas including $O_2$ gas. Accordingly, it is possible to obtain a mask layer having opening patterns, each of which is formed of two adjacent silicon oxide films 55 with a fine width therebetween, as shown in FIG. 3C (double patterning).

Then, it is possible to form on the polysilicon film 51 a small-sized opening that meets the demand for the scaling-down of a semiconductor device by etching the polysilicon film 51 with the mask layer.

The reinforcement films 55 formed in opposite sides of the line portion after the deposition/trimming process in accordance with the present embodiment may be used as sidewalls in a sidewall method, which is a recently developed semiconductor manufacturing technique. At this time, the distance between the sidewalls can be controlled by adjusting trimmed amount of the line width of the line portion thereof, i.e., by adjusting the thickness of the formed silicon oxide film.

Although the photoresist film is employed as the organic film in the present embodiment, the organic film that is subjected to the deposition/trimming process is not limited to the photoresist film. Alternatively, another organic film serving a mask layer may be employed. Further, the organic film is not limited to a surface layer of a target substrate, but can be an intermediate layer.

In the present embodiment, the substrate to be subjected to the plasma treatment is not limited to a wafer for semiconductor devices. For example, the substrate may be one of various kinds of a substrate, which can be used in a flat panel display (FPD) or the like including a liquid crystal display (LCD), a photomask, a CD substrate, a print substrate or the like.

The purpose of the present invention can be achieved by providing a system or an apparatus with a storage medium or the like storing program codes of software realizing the functions of the present embodiment and allowing a computer (or a central processing unit (CPU) or a microprocessor unit (MPU)) thereof to read and execute the program codes stored in the medium.

In this case, the program codes themselves read from the medium realize the functions of the aforementioned embodiment and the present invention includes the program codes and the medium storing the program codes.

The medium for providing the program codes may be, e.g., a floppy (registered trademark) disk; a hard disk; an optical disk, e.g., a magneto-optical disk, CD-ROM, CD-R, CD-RW, DVD-ROM, DVD-RAM, DVD-RW, DVD+RW or the like; a magnetic tape; a nonvolatile memory card; ROM; or the like. The program codes may also be downloaded through networks.

The functions of the aforementioned embodiment can be realized by executing the program codes read by the computer. Alternatively, an operating system (OS) or the like operating on the computer can execute a part or the whole of the actual processing in accordance with the instructions of the program codes and the functions of the embodiment can be realized by the processing executed by the OS or the like.

In addition, the program codes can be read from a storage and inputted to a memory in a built-in function extension board or an external function extension unit of a computer and the functions of the embodiment can be realized by the processing of a CPU or the like in the extension board or the extension unit, which executes the extension function thereof according to the instructions of the program codes to perform a part or the whole of the actual processing.

While the invention has been shown and described with respect to the embodiments, it will be understood by those skilled in the art that various changes and modifications may be made without departing from the scope of the invention as defined in the following claims.

What is claimed is:

1. A method for processing a substrate including a processing target layer and an organic film, the method comprising:
a deposition/trimming process of forming a reinforcement film on a surface of the organic film and, at the same time, trimming a line width of a line portion of the organic film constituting an opening pattern,
wherein the deposition/trimming process includes an adsorption process for allowing a silicon-containing gas to be adsorbed onto the surface of the organic film; and an oxidation process in which the line width of the organic film is trimmed while the adsorbed silicon-containing gas is converted into a silicon oxide film serving as the reinforcement film.

2. The method of claim 1, wherein a monovalent aminosilane is employed as the silicon-containing gas.

3. The method of claim 1, wherein, in the adsorption process, a processing pressure is in the range from approximately $1.33 \times 10^{-1}$ Pa (1 mTorr) to $1.33 \times 10$ kPa (100 Torr).

4. The method of claim 1, wherein, in the adsorption process, a processing temperature is in a range from approximately 20° C. to 700° C.

5. The method of claim 1, wherein, in the oxidation process, the line width of the organic film is trimmed and, at the same time, the silicon-containing gas adsorbed onto the surface of the organic film is converted into the silicon oxide film by oxygen radicals generated by plasma-exciting an oxygen-containing gas serving as an oxidizing gas.

6. The method of claim 1, wherein, in the oxidation process, a processing pressure is in the range from approximately $1.33 \times 10^{-1}$ Pa (1 mTorr) to $1.33 \times 10$ kPa (100 Torr).

7. The method of claim 1, wherein, in the oxidation process, a processing temperature is in the range from approximately 20° C. to 700° C.

8. The method of claim 1, wherein the line width of the line portion of the organic film is equal to or smaller than approximately 60 nm.

9. The method of claim 1, further comprising a reinforcement film etching process of partially etching the reinforcement film formed in the deposition/trimming process to expose the trimmed line portion of the organic film.

10. The method of claim 1, further comprising repeating the deposition/trimming process until a required mask layer is obtained, wherein the reinforcement film obtained by the repetition of the deposition/trimming process serves as the mask layer.

11. The method of claim 2, wherein, in the adsorption process, a processing pressure is in the range from approximately $1.33 \times 10^{-1}$ Pa(1 mTorr) to $1.33 \times 10$ kPa(100 Torr).

12. The method of claim 3, wherein, in the adsorption process, a processing temperature is in a range from approximately 20° C. to 700° C.

13. The method of claim 6, wherein, in the oxidation process, a processing temperature is in the range from approximately 20° C. to 700° C.

14. The method of claim 13, wherein, the silicon-containing gas adsorbed onto the surface of the organic film is converted into the silicon oxide film by oxygen radicals generated by plasma-exciting an oxygen-containing gas serving as an oxidizing gas by applying a high frequency power ranging from 500 W to 3000 W.

15. The method of claim 11, wherein, in the adsorption process, a processing temperature is in a range from approximately 20° C. to 700° C.

16. The method of claim 15, wherein, in the oxidation process, a processing pressure is in the range from approximately $1.33 \times 10^{-1}$ Pa(1 mTorr) to $1.33 \times 10$ kPa(100 Torr).

17. The method of claim 16, wherein, in the oxidation process, a processing temperature is in the range from approximately 20° C. to 700° C.

18. The method of claim 17, wherein, the silicon-containing gas adsorbed onto the surface of the organic film is converted into the silicon oxide film by oxygen radicals generated by plasma-exciting an oxygen-containing gas serving as an oxidizing gas by applying a high frequency power ranging from 500 W to 3000 W.

* * * * *